United States Patent [19]

Matyas

[11] Patent Number: 5,686,860
[45] Date of Patent: Nov. 11, 1997

[54] AMPLIFIER AND CONTROLLING APPARATUS OPERATING FROM A UNIPOLAR POWER SUPPLY

[75] Inventor: Ladislav Matyas, Horni Becva, Czechoslovakia

[73] Assignee: Motorola, Inc., Schaumburg, Ill.

[21] Appl. No.: 533,034

[22] Filed: Sep. 25, 1995

[51] Int. Cl.[6] .............................. H03K 17/18; G05F 1/10
[52] U.S. Cl. ........................... 327/540; 327/379; 307/130
[58] Field of Search ..................... 327/535, 536, 327/537, 538, 540, 541, 543, 546, 198, 374–377, 379, 391; 307/86–87, 126, 130, 52

[56] References Cited

U.S. PATENT DOCUMENTS

| | | | |
|---|---|---|---|
| 4,873,453 | 10/1989 | Schmerda et al. | 307/130 |
| 5,254,936 | 10/1993 | Leaf et al. | 307/84 |
| 5,264,732 | 11/1993 | Fiorina et al. | 307/66 |
| 5,432,501 | 7/1995 | Yoon | 327/538 |
| 5,444,362 | 8/1995 | Chung et al. | 327/538 |
| 5,461,338 | 10/1995 | Hirayama et al. | 327/538 |
| 5,483,151 | 1/1996 | Yamashita | 327/538 |
| 5,534,818 | 7/1996 | Peterson | 327/538 |
| 5,539,353 | 7/1996 | Kajimoto et al. | 327/538 |

FOREIGN PATENT DOCUMENTS 0064898  1/1985  European Pat. Off. .

Primary Examiner—Timothy P. Callahan
Assistant Examiner—My-Trang Nu Ton
Attorney, Agent, or Firm—Robert M. Handy; Harry A. Wolin; Rennie William Dover

[57] ABSTRACT

An amplifier controller (104) is described for operating from a single voltage power supply (105). A switch (103) is coupled between the amplifier (102) and the power supply (105). The controller (104) includes a power conditioning circuit (106) for generating doubled and tripled voltages and positive and negative voltages for operating the controller (104) and the amplifier (102). Internal voltage regulators (138, 142) control the magnitude of the generated voltages. The controller (104) further includes: (i) a circuit (172) for disabling the controller (104) and amplifier (102) in response to an idle signal presented thereto, (ii) a circuit (178) for energizing the switch in response to a turn-on signal (128) so that the amplifier (102) can amplify, and (iii) a circuit (176) for sensing the presence or absence of negative polarity (Vss) on a second lead (188) of the amplifier (102) and, if not present, disabling the switch (103) despite the presence of the turn-on signal. The controller (104) can be integrated in a single IC.

19 Claims, 1 Drawing Sheet

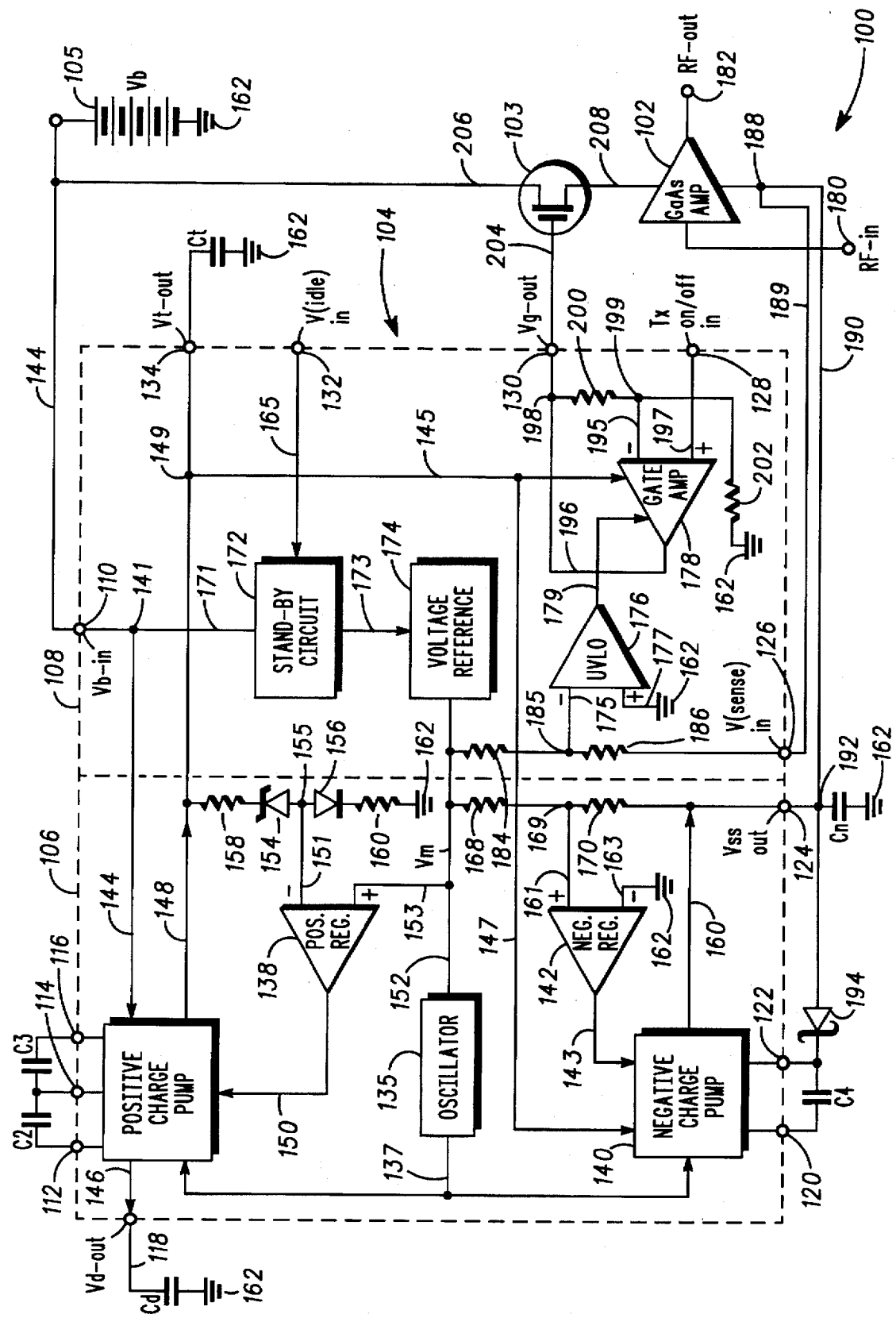

5,686,860

AMPLIFIER AND CONTROLLING APPARATUS OPERATING FROM A UNIPOLAR POWER SUPPLY

BACKGROUND OF THE INVENTION

The present invention pertains to a power amplifier and control apparatus therefore.

Power amplifiers are common items in modern day radio telephony. Because of their excellent performance at high frequencies, their small size and light weight, solid state transistor amplifiers using GaAs semiconductors are preferred for portable applications requiring radio frequency (RF) power amplifiers. However, in order to operate safely and efficiently, a complex arrangement for supplying power to and controlling operation of the amplifier has frequently been required. A further complication is that the manner in which the amplifier is turned on and off must be carefully pre-determined in order to minimize non-linear effects which lead to generation of spurious signals in channels outside of that being used for communication. A still further complication is that, in most instances, it is desired to operate the power amplifier from a single voltage power source. As a consequence of these and other requirements, complex, bulky and inefficient circuits have been needed, in the prior art, to control and operate such amplifiers. Thus, the overall amplifier function has been less attractive than is desired in one or more aspects of size, weight, cost and power consumption.

BRIEF DESCRIPTION OF THE DRAWING

The sole FIGURE shows a simplified schematic circuit diagram of a preferred embodiment of the present invention.

DESCRIPTION OF THE PREFERRED EMBODIMENT

The sole FIGURE shows in simplified schematic form, and according to a preferred embodiment of the present invention, circuit 100 incorporating power amplifier 102. While power amplifier 102 is conveniently a GaAs power amplifier, those of skill in the art will understand that amplifiers of other materials and properties can also be used and that amplifier 102 may have a single stage or multiple stages of amplification. Accordingly, as used herein the term "amplifier" and "power amplifier" are intended to include such other amplifying structures.

Coupled in series with amplifier 102 is switch 103. Switch 103 is conveniently an N-channel MOSFET but this is not essential. Other forms of switches are also suitable and switch 103 can be a single stage or a multiple stage switch according to the needs of the user. The purpose of switch 103 is to couple and decouple amplifier 102 from power source 105. Switch 103 turns amplifier 102 on and off in a controlled manner.

Circuit 100 is desired to operate from single, unipolar power source 105. While power source 105 is shown as being a battery, which is especially convenient for portable applications, this is not essential. Any form of power source can be used and the word "battery" is intended to include such alternatives.

Circuit 100 has portion 104 shown within dashed lines 106, 108. Portion 104 is conveniently incorporated within a single monolithic integrated circuit (IC) so as to minimize one or more of size, weight, cost and power consumption. This is especially desirable for portable applications. Unless otherwise noted, the abbreviation "IC" or "IC 104" is intended to refer to the combination of elements within dashed outlines 106, 108 and having external terminals 110–134 or equivalent.

In most cases, it is desirable to have both positive and negative voltages for supplying amplifier 102 and switch 103. Portion 106 of IC 104 provides power conditioning, that is, it derives from single voltage Vb supplied by battery 105 via terminal 110, the voltages needed to properly operate amplifier 102. Portion 108 of IC 104 provides control functions to insure the proper operation and safety of amplifier 102 and switch 103. The combination of power conditioning portion 106 and control portion 108 which can be readily integrated in common IC 104 is a particular feature of the present invention.

Power conditioning portion 106 conveniently includes oscillator 135, positive charge pump 136, positive regulator 138, negative charge pump 140 and negative regulator 142. Oscillators, charge pumps and regulators are electronic functions individually well known in the art. Oscillator 135 conveniently provides a square wave output with approximately 50% duty cycle, although this is not essential. Oscillator 135 conveniently operates at about 100kHz, but higher or lower frequencies can also be used. The exact frequency is not critical. Oscillator 135 provides the square wave output to positive charge pump 136 and negative charge pump 140 via line 137.

Positive charge pump 136 receives power from Vb-in terminal 110 which is coupled to power source 105 via line 144. External capacitors C2 and C3 (e.g., external to IC 104) are coupled via terminals 112, 114, 116 to positive charge pump 136. Capacitors C2 and C3 are used by positive charge pump 136 in a conventional manner to provide voltage doubling and voltage tripling. Positive doubled voltage Vd is coupled to terminal 118 via line 146 and stored on (e.g., external) capacitor Cd. Positive tripled voltage Vt is coupled to terminal 134 via line 148 and stored on (e.g., external) capacitor Ct. Those of skill in the art will understand based on the description herein that the terms "doubled" and "tripled" refer approximately to the magnitude of power supply voltage Vb but are not intended to be exact since losses occur in the switching and rectifying functions needed to perform the voltage doubling and tripling and the magnitude of Vd and Vt also depend upon the regulating signal being provided from positive regulator 138 to positive charge pump 136 via line 150.

Positive regulator 138 is conveniently a differential amplifier comparing the voltage received at (e.g. negative) input 151 with the voltage received at (e.g., positive) input 153 to provide an output on line 150 to control the magnitude of the voltages being generated by positive charge pump 136. Input 151 is conveniently coupled to common node 155 of back-to-back diodes 154, 156 which are in turn coupled, respectively, by resistor 158 to line 148 and by resistor 160 to common ground 162. Diode 154 is conveniently a Zener diode. Input 153 is coupled to line 152 on which appears master reference voltage Vm. Thus, the action of positive regulator 138 is to compare a portion of Vt appearing on line 148 from positive charge pump 136 to master reference voltage Vm appearing on line 152 and adjust the output of charge pump 136 until Vt has the proper value relative to Vm. The generation of Vm is discussed later.

Negative charge pump 140 works in an analogous manner, receiving square wave signals from oscillator 135 via line 137, and being coupled via terminals 120, 122 to (e.g., external) voltage doubling capacitor C4. Negative charge pump 140 receives Vt from positive charge pump 136 via lines 148, 145, 147 and a control signal from negative regulator 142 via line 143. Negative regulator 142 is conveniently a differential amplifier comparing the voltage at (e.g. positive) input 161 to the common (ground 162) potential appearing at (e.g., negative) input 163, to provide an output on line 143 to control the magnitude of voltage Vss being generated by negative charge pump 140. Input 161 is conveniently coupled to common node 169 of resistors 168, 170. Resistor 168 is further coupled to line 152 supplying master reference voltage Vm and resistor 170 is further coupled to Vss-out terminal 124 and, via line 160, to the output of negative charge pump 140. Thus, the action of negative regulator 142 is to compare a portion of Vss appearing on line 160 from negative charge pump 140 to master reference voltage Vm appearing on line 152 and adjust the output of charge pump 140 until Vss has the desired value relative to Vm. Node 192 is coupled to Vss-out terminal 124. Schottky diode 194 is coupled from node 192 to capacitor C4 and terminal 122. Capacitor Cn is coupled from node 192 to ground 162. Vss appears across capacitor Cn. A feature of the present invention is that regulators 138, 142 enable circuit 104 to operate over a significant range of temperature and Vb-in voltages, for example, as might be encountered due to changing environmental conditions for a portable phone or as battery 105 discharges.

The optimal values of Vss-out and Vg-out at terminals 124 and 130 depend upon the characteristics of amplifier 102 and switch 103 selected by the user. Persons of skill in the art will understand, based on the particular amplifier and switch chosen for their application, how to vary the values of resistors 158, 160, 168, 170 and the related voltage references in order to achieve the proper Vss-out and Vg-out voltages levels.

Control circuit portion 108 comprises stand-by circuit 172, voltage reference 174, upper voltage lock-out (UVLO) circuit 176 and gate driver amplifier 178. Stand-by circuit 172 receives power from battery 105 via terminal 110 and line 171 and sends power via line 173 to voltage reference 174. Control line 175 extends from V(idle-in) terminal 132 to stand-by circuit 172. Stand-by circuit 172 acts as a switch to disable circuit 100 when the system does not require amplifier 102 to function. This is done by cutting off battery power to oscillator 135 and other elements coupled to voltage reference 174. In the preferred embodiment, stand-by circuit 172 is "open" when V(idle-in) applied at terminal 132 is equal to zero volts relative to ground 162. In this condition, no significant power is consumed by circuit 100 and amplifier 102 is in an "off" state (i.e., RF input signals presented at terminal 180 are not amplified). When V(idle) is greater than or equal about two volts, stand-by circuit 172 is "closed", power is applied to circuit 100 and amplifier 102 is in an "on" state and able to amplify signals presented at input terminal 180 and deliver the amplified signal to output terminal 182. Stand-by circuit 172 is desirable but not essential.

Voltage reference 174 receives power from battery 105 via stand-by circuit 172 and line 173. The function of element 174 is to provide on line 152, master reference voltage Vm. A convenient value of Vm is about 1.27 volts, which is readily obtained using a Widlar band-gap reference circuit well known in the art. While this value and choice of reference circuit are preferred, other means of generating a predetermined master reference voltage may also be used and other values of Vm chosen, according the type of amplifier 102 and switch 103 that the user desires to employ. Persons of skill in the art will understand, based on the description herein, how to select a master reference voltage and reference circuit for their particular application.

UVLO circuit 176 is conveniently a differential amplifier with (e.g., positive) input 175 coupled to node 185 between resistors 184, 186, and (e.g., negative) input 177 coupled to ground 162. Resistor 184 is further coupled to Vm line 152 and resistor 186 is further coupled via line 187 to V(sense) terminal 126. V(sense) terminal 126 is desirably coupled via line 189 to node 188 adjacent to amplifier 102 in line 190 running from amplifier 102 to Vss-out terminal 124 of IC 104 via node 192.

Output 179 of UVLO circuit 176 is coupled to gate amplifier 178 so as to control, in part, the operation of amplifier 178. Gate amplifier 178 has (e.g., negative) input 195 coupled to node 199 between resistors 200, 202. Resistor 200 is further coupled to node 198 in output lead 196 of gate amplifier 178 and resistor 202 is further coupled to ground 162. Gate amplifier 178 receives tripled power supply voltage Vt via lead 145 from node 149. Gate amplifier 178 has (e.g., positive) input 197 coupled to Tx-on/off input terminal 128. Assuming that the action of UVLO circuit 176 has not disabled gate amplifier 178, applying an "on" signal to Tx-on/off input terminal 128 causes amplifier 178 to provide a signal on lead 196 sufficient to energize gate 204 of switch 103 so that current can flow between source-drain leads 206, 208 and thereby energize amplifier 102. Persons of skill in the art will understand that the type of device used for switch 103 and the polarity of the driving signals to energize switch 103 will vary depending upon the particular choice of amplifier 102 and, based on the description herein, such variations are within the competence of persons of ordinary skill in the art.

The function of UVLO circuit 176 in combination with gate amplifier 178 is to prevent amplifier 102 from being connected to battery 105 if Vss is not present and negative. For example, if a negative voltage (e.g., Vss or the like) is present at node 188, then input 175 of UVLO circuit 176 is pulled negative and UVLO circuit 176 produces no output on lead 179, thereby permitting amplifier 178 to function normally. Conversely, if a negative voltage is not present at node 188, then input 175 drifts positive to Vm and a large output is provided by UVLO 176 thereby cutting off amplifier 178 so that switch 103 cannot be turned on even if Vtx-on is present at terminal 128. Node 188 is desirably electrically close to amplifier 102 so that spurious signals and other errors are avoided. While it is preferred to couple V(sense) terminal 126 to node 188, this is not essential. V(sense) terminal 126 can be connected to Vss-out terminal 124.

A further feature of the present invention is that amplifier 178 conveniently provides a controlled rise and fall time. When presented with, for example, an abrupt Off-On Vtx transition signal at terminal 128, the output voltage on lead 196 from amplifier 178 follows a predetermined and more gradual rise time, and conversely, when Vtx undergoes an abrupt On-Off transition, amplifier 178 provides a predetermined and more gradual fall-time. This is important because it substantially reduces the generation of high frequency transients and out-of-band modulation products which would otherwise result from rapid transition of amplifier 102 between "off" and "on" states. The rise and fall time of amplifier 178 are readily predetermined by appropriate RC time constants built into amplifier 178.

Alternatively, amplifier 178 can be provided with a rapid response characteristics and the rise and fall time of the turn on/off of amplifier 102 controlled by the rise and fall time of the applied Tx-on/off signal. Either method works.

When in the "on" state, amplifier 102 receives a signal, e.g., an RF signal, at terminal 180 and provides an amplified output at terminal 182. The RF signal can be continuously supplied to terminal 180 and the operation of amplifier 102 controlled by the combination of V(idle) applied to terminal 132 and V(Tx-on/off) applied to terminal 128.

Based on the foregoing description, it will be apparent that the invented combination provides an efficient, compact and effective apparatus for controlling an amplifier, especially a GaAs RF amplifier. By virtue of the ability to integrate nearly all of the required components in a single IC, low cost, high performance and small size can be simultaneously achieved. The combination of on-board power conditioning circuits combined with on-board control and protection circuits provides an overall amplifier control apparatus of great utility.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. An apparatus for controlling an amplifier, the apparatus operating from a unipolar power supply having a first voltage of a predetermined first polarity and predetermined first magnitude, characterized by:

a power conditioning portion for generating from the first voltage, a second voltage of the first polarity and of a second magnitude, and a third voltage of a second polarity opposite the first polarity and of a third magnitude, wherein at least one of the second and third magnitudes is greater than the first magnitude; and a control portion having therein, (i) a means for energizing a switch connecting the amplifier to the power supply in response to a turn-on signal, and (ii) a means for sensing the second polarity, and if not present, disabling the means for energizing the switch, despite the turn-on signal.

2. The apparatus of claim 1 wherein the power conditioning portion comprises a first charge pump, a second charge pump and an oscillator, wherein the oscillator is able to receive power from the power supply and provide an alternative current output signal to the first charge pump and to the second charge pump, wherein the first charge pump provides the second voltage and the second charge pump provides the third voltage.

3. The apparatus of claim 2 wherein the power conditioning portion further comprises, (a) a first voltage regulator having a first input coupled to an output of the first charge pump, and a second input coupled to a reference voltage, and an output coupled to the first charge pump to modify the output of the first charge pump, and (b) a second voltage regulator having a first input coupled to the reference voltage and an output of the second charge pump, and a second input coupled to a common potential and an output coupled to the second charge pump to modify the output of the second charge pump.

4. The apparatus of claim 2 wherein the first charge pump provides the second voltage of the second magnitude on a first output thereof and further provides a fourth voltage having a fourth magnitude larger than the second magnitude on a second output thereof.

5. The apparatus of claim 1 wherein the control portion comprises a means for disabling the apparatus in response to an idle signal presented thereto.

6. The apparatus of claim 1 wherein at least one of the second and third voltages is supplied to a terminal of the amplifier.

7. The apparatus of claim 1 wherein the power conditioning portion comprises a circuit for producing a fourth voltage of a fourth magnitude wherein the fourth magnitude is approximately triple the first magnitude.

8. The apparatus of claim 1 wherein the power conditioning portion comprises a first circuit for producing the second voltage of the second magnitude wherein the second magnitude is approximately at least double the first magnitude.

9. The apparatus of claim 8 where the power conditioning portion further comprises a second circuit for producing the third voltage of the third magnitude wherein the third magnitude is larger than the first magnitude.

10. The apparatus of claim 9 wherein the power conditioning portion comprises an oscillator coupled to the first and second circuits.

11. The apparatus of claim 9 wherein the power conditioning portion comprises one or more regulators coupled to at least one of the first and second circuits.

12. The apparatus of claim 1 wherein the means for sensing the second polarity comprises a differential amplifier having one lead coupled to a terminal for detecting the second polarity, and another lead coupled to a reference potential.

13. The apparatus of claim 12 wherein the means for energizing a switch, comprises a further differential amplifier having a first lead coupled to a voltage provided by the power conditioning portion, and a further lead coupled to an amplifier "turn -on/turn-off" signal and a still further lead coupled to a control lead of a semiconductor switch.

14. An apparatus for operating from a power supply having a first voltage of a first magnitude and first polarity, to amplify signals, characterized by:

an amplifier for amplifying signals presented to an input terminal thereof and providing amplified signals to an output terminal thereof, the amplifier having a first power lead and a second power lead;

a power conditioning circuit for coupling to the power supply and the amplifier, for generating from the first voltage a second voltage of the first polarity and a third voltage of opposite polarity, wherein at least one of the second and third voltages has a magnitude greater than the first magnitude;

a switch coupled in series with the amplifier between the first power lead of the amplifier and a connector of the power supply and wherein a portion of the third voltage is coupled to the second power lead of the amplifier; and a control circuit for operating the switch and having therein, (i) a circuit for energizing the switch in response to a turn-on signal, and (ii) a circuit for sensing whether the opposite polarity is present on the second lead of the amplifier and, if the opposite polarity is not present, disabling the switch, despite the turn-on signal.

15. The apparatus of claim 14 wherein the control circuit comprises a further circuit for disabling amplifier in response to an idle signal presented to the apparatus.

16. An apparatus for operating from a power supply coupled to first and second connections between which appears a first power supply voltage of a first polarity and first magnitude, to operate an amplifier, wherein the amplifier has an input terminal, an output terminal, a first power terminal and a second power terminal, the apparatus being characterized by:

a power conditioning portion coupled to the first and second connections and to the second power terminal for generating from the first power supply voltage, a second voltage of the first polarity and a third voltage of an opposite polarity, wherein the second voltage has a magnitude greater than the first magnitude;

a switch coupled in series with the amplifier between the first power terminal of the amplifier and the first connection; and a control portion coupled to the power conditioning portion for operating the switch and having therein a circuit for energizing the switch in response to a turn-on signal.

17. The apparatus of claim 16 wherein the power conditioning portion comprises (a) a first voltage multiplier circuit producing multiple voltages including the second voltage and which are of the first polarity and of magnitudes approximately doubled and tripled, respectively, relative to the first magnitude, (b) a second voltage multiplier circuit producing the third voltage of the opposite polarity and of magnitude approximately doubled relative to the first magnitude, (c) an oscillator coupled to the power supply and providing an oscillating signal to the first voltage multiplier circuit and to the second voltage multiplier circuit and, (d) a first regulator controlling the first voltage multiplier circuit and a second regulator controlling the second voltage multiplier circuit.

18. The apparatus of claim 16 wherein the power conditioning portion provides to the second terminal of the amplifier a further voltage derived from the third voltage.

19. The apparatus of claim 18 wherein the further voltage has the same polarity as the third voltage and the control portion further comprises a circuit for sensing presence or absence of the further voltage and, if the further voltage is not present, disabling the switch, despite the turn-on signal.

\* \* \* \* \*